(12) United States Patent
Brower

(10) Patent No.: US 11,996,257 B2
(45) Date of Patent: May 28, 2024

(54) CIRCUIT INTERRUPTING DEVICE HAVING PRINTED CIRCUIT BOARD COILS

(71) Applicant: Hubbell Incorporated, Shelton, CT (US)

(72) Inventor: John E. Brower, Fairfield, CT (US)

(73) Assignee: Hubbell Incorporated, Shelton, CT (US)

( * ) Notice: Subject to any disclaimer, the term of this patent is extended or adjusted under 35 U.S.C. 154(b) by 0 days.

(21) Appl. No.: 17/985,758

(22) Filed: Nov. 11, 2022

(65) Prior Publication Data

US 2023/0072455 A1 Mar. 9, 2023

Related U.S. Application Data

(63) Continuation of application No. 16/520,588, filed on Jul. 24, 2019, now Pat. No. 11,501,931.

(60) Provisional application No. 62/703,106, filed on Jul. 25, 2018.

(51) Int. Cl.
| | | |
|---|---|---|
| *H05K 1/16* | (2006.01) | |
| *G01R 31/327* | (2006.01) | |
| *H01H 9/50* | (2006.01) | |
| *H01H 71/08* | (2006.01) | |
| *H01H 71/12* | (2006.01) | |

(52) U.S. Cl.
CPC ........... *H01H 9/50* (2013.01); *G01R 31/3277* (2013.01); *H01H 71/08* (2013.01); *H01H 71/125* (2013.01); *H05K 1/165* (2013.01); *H05K 2201/09027* (2013.01); *H05K 2201/09063* (2013.01)

(58) Field of Classification Search
CPC ...... H01H 9/50; H01H 71/125; G01R 31/327; G01R 31/3277; H05K 2201/09063; H05K 2201/09027
See application file for complete search history.

(56) References Cited

U.S. PATENT DOCUMENTS

| | | |
|---|---|---|
| 5,568,344 A | 10/1996 | Gernhardt et al. |
| 7,253,629 B1 | 8/2007 | Richards |
| 7,751,160 B1 | 7/2010 | Radosavljavic et al. |
| (Continued) | | |

FOREIGN PATENT DOCUMENTS

| | | | | |
|---|---|---|---|---|
| CA | 2813933 | 11/2013 | | |
| CN | 105518474 B | * 11/2017 | ............. | G01R 31/00 |
| WO | WO-2022149012 A1 | * 7/2022 | ........... | G01R 15/181 |

OTHER PUBLICATIONS

PCT/US2019/043150 International Search Report and Written Opinion dated Oct. 15, 2019.

(Continued)

*Primary Examiner* — Sisay G Tiku
(74) *Attorney, Agent, or Firm* — Michael Best & Friedrich LLP

(57) ABSTRACT

A circuit interrupter including a line conductor, a printed-circuit board, and a test circuit. The printed-circuit board coil is embedded on a printed circuit board. The printed circuit board includes a slot through the printed-circuit board coil, wherein the line conductor is received by the printed-circuit board coil. The test circuit is electrically connected to the printed-circuit board coil. The test circuit is configured to determine a condition of the line conductor based on a signal of the printed-circuit board coil.

10 Claims, 8 Drawing Sheets

(56) References Cited

U.S. PATENT DOCUMENTS

| | | |
|---|---|---|
| 9,431,816 B2 | 8/2016 | Parker et al. |
| 2005/0212522 A1 | 9/2005 | Finlay et al. |
| 2005/0260962 A1 | 11/2005 | Nazrul et al. |
| 2008/0239596 A1 | 10/2008 | Restrepo |
| 2009/0074226 A1 | 3/2009 | Eaton et al. |
| 2009/0198459 A1 | 8/2009 | Bilac |
| 2009/0251148 A1 | 10/2009 | Finlay |
| 2011/0221600 A1 | 9/2011 | Kinsel |
| 2011/0222194 A1 | 9/2011 | Kinsel |
| 2012/0119918 A1* | 5/2012 | Williams ............... H02H 3/335 324/509 |
| 2013/0236337 A1 | 9/2013 | Gummin et al. |
| 2013/0293989 A1 | 11/2013 | Shipley et al. |
| 2015/0062760 A1 | 3/2015 | Simonin |
| 2016/0116504 A1 | 4/2016 | Tang et al. |
| 2019/0363531 A1* | 11/2019 | Ostrovsky .............. H02H 3/044 |

OTHER PUBLICATIONS

Office Action issued in Chinese Patent Application No. 201980052123.0 dated May 31, 2023.

* cited by examiner

CIRCUIT INTERRUPTING DEVICE HAVING PRINTED CIRCUIT BOARD COILS

RELATED APPLICATIONS

This application claims priority to U.S. patent application Ser. No. 16/520,588, filed Jul. 24, 2019, which claims priority to U.S. Provisional Patent Application No. 62/703,106, filed on Jul. 25, 2018, the entire contents of both of which are incorporated herein by reference.

FIELD

Embodiments relate to circuit interrupting devices, such as a ground fault circuit interrupter (GFCI) and/or an arc fault circuit interrupter (AFCI).

SUMMARY

Circuit interrupters are safety devices intended to protect a user from electric shock. GFCIs sense an imbalance in current flowing between hot and neutral conductors, and cut off power to the load, while AFCI sense an arc fault, and cut off power to the load. GFCI and/or AFCI may be implemented into electrical receptacles. In such an implementation, space within the electrical receptacle may be an issue.

Thus, one embodiment provides a circuit interrupter including a line conductor, a printed-circuit board, and a test circuit. The printed-circuit board coil is embedded on a printed circuit board. The printed circuit board includes a slot through the printed-circuit board coil, wherein the line conductor is received by the printed-circuit board coil. The test circuit is electrically connected to the printed-circuit board coil. The test circuit is configured to determine a condition of the line conductor based on a signal of the printed-circuit board coil.

Other aspects of the application will become apparent by consideration of the detailed description and accompanying drawings.

DETAILED DESCRIPTION

Before any embodiments of the application are explained in detail, it is to be understood that the application is not limited in its application to the details of construction and the arrangement of components set forth in the following description or illustrated in the following drawings. The application is capable of other embodiments and of being practiced or of being carried out in various ways.

Figure 1:
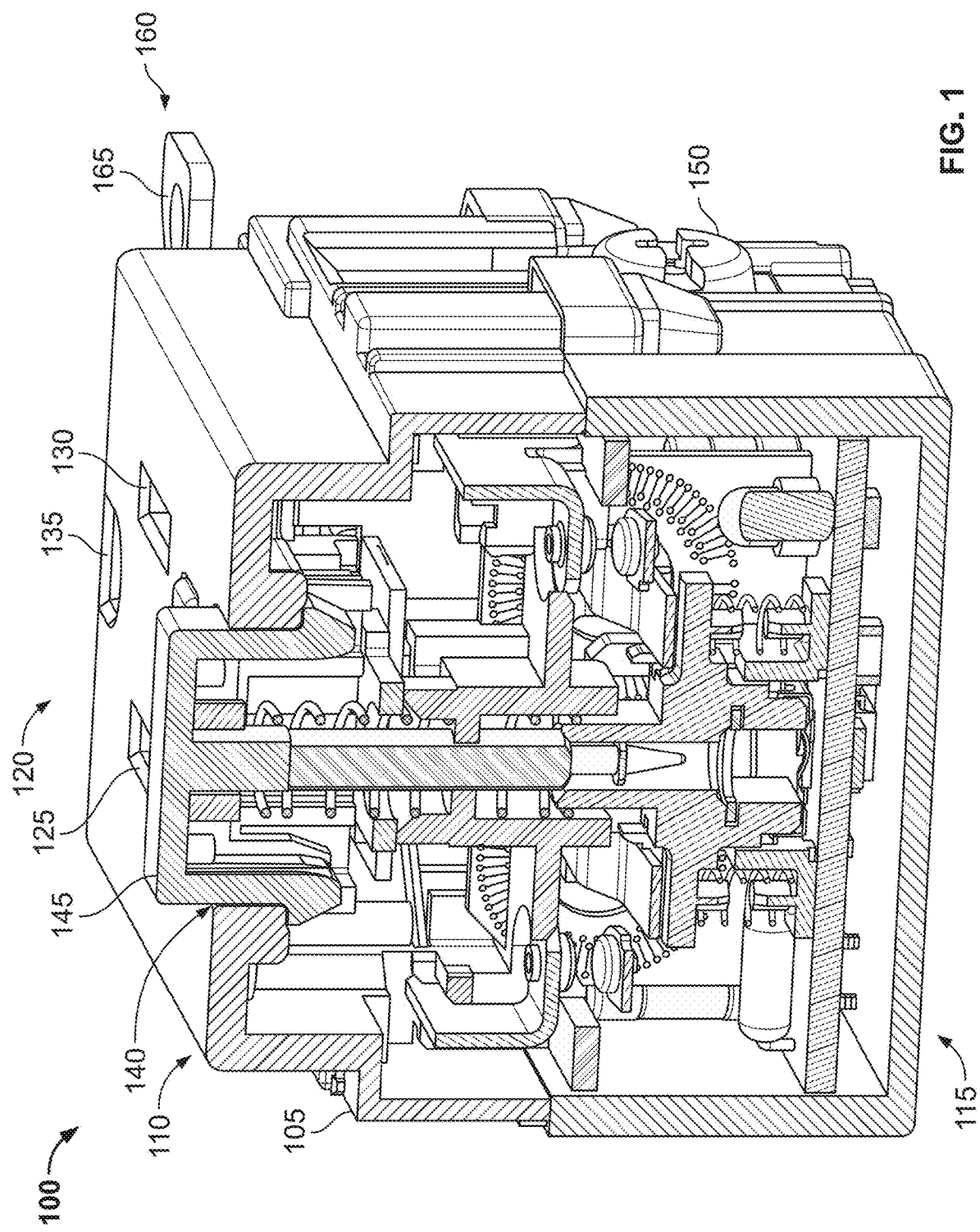
FIG. 1 is a perspective cutaway view of a circuit interrupting device according to some embodiments.

FIG. 1 is a perspective cutaway view of a circuit interrupting device 100 according to some embodiments. The circuit interrupting device 100 includes a housing 105 having a front cover 110 and a rear cover 115. The housing 105 may be formed of plastic, or a similar material.

The front cover 110 may include a duplex outlet face 120 with a phase opening 125, a neutral opening 130, and a ground opening 135. The face 120 may further include an opening 140 accommodating a RESET button 145. Although not illustrated, in some embodiments, the face 120 may include additional openings to accommodate additional buttons (for example, a TEST button), as well as additional openings to accommodate various indicators (for example, light-emitting diodes (LEDs), buzzers, etc.). The rear cover 115 is secured to the front cover 110 and may include one or more terminal screws 150. In some embodiments, the terminal screws 150 include a line terminal screw, a neutral terminal screw, and/or a ground terminal screw. Contained within the front and rear covers 110, 115 is a manifold 155. Manifold 155 provides support for a yoke/bridge assembly 165 configured to secure the device 100 to an electrical box.

Figure 2A:
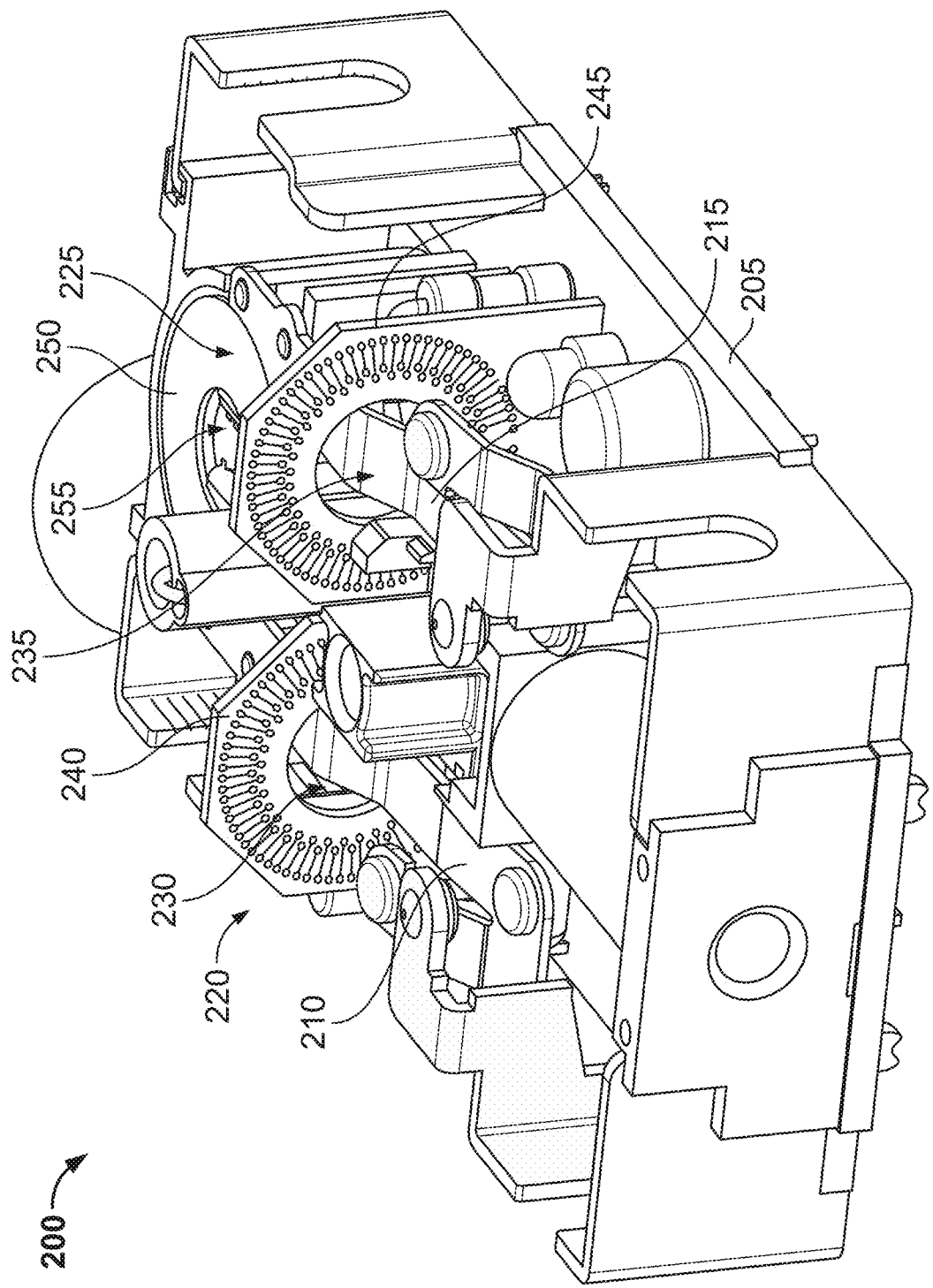
FIGS. 2A and 2B are perspective views of a core assembly of the circuit interrupting device of FIG. 1 according to some embodiments
Figure 2B:
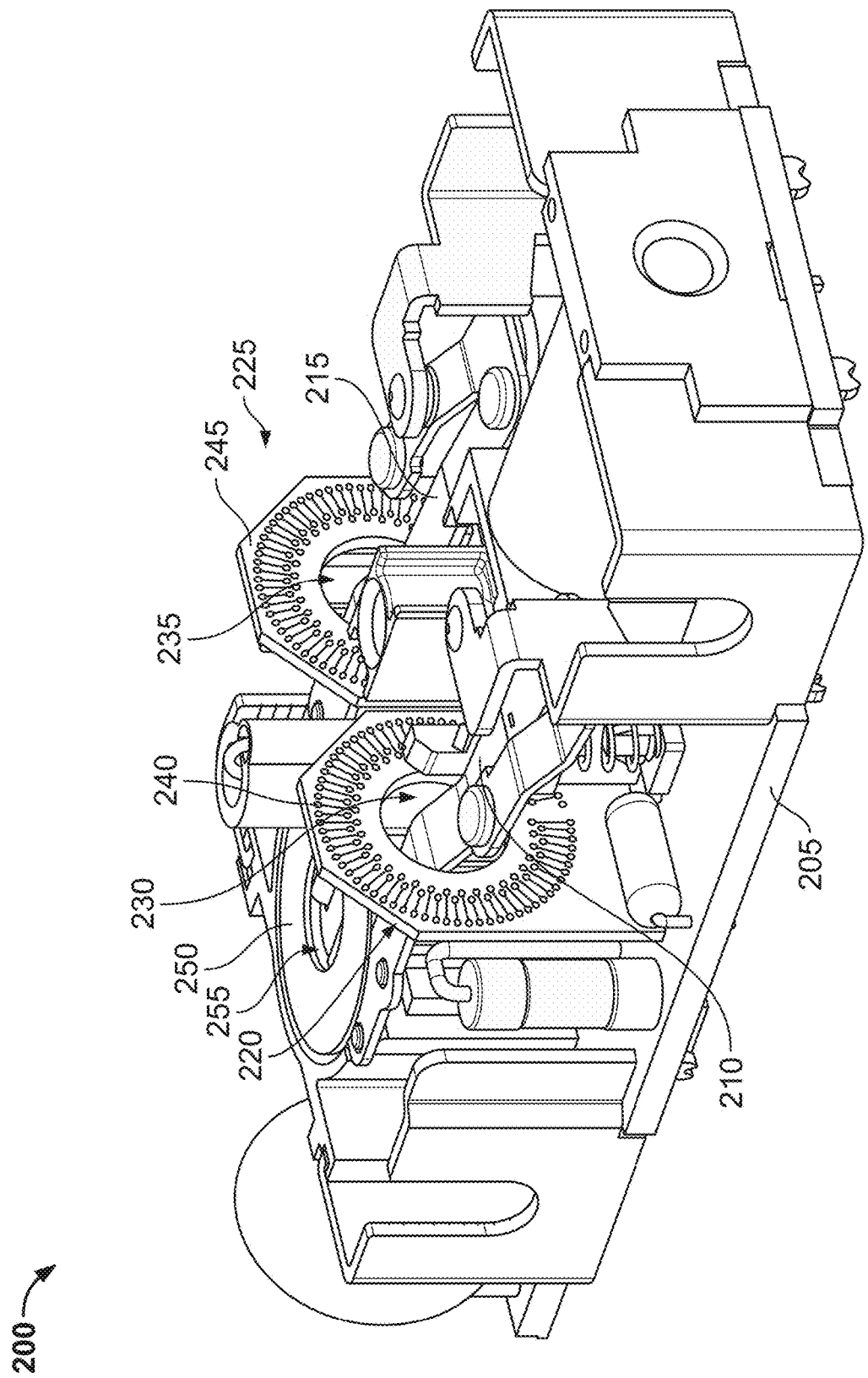

FIGS. 2A and 2B illustrate perspective views of a core assembly 200 according to some embodiments. The core assembly 200 is configured to support a printed circuit board 205 that supports most of the working components of the device 100, including the control system 400 illustrated in FIG. 4. The core assembly 200 further supports a line conductor 210 and a neutral conductor 215. The line and neutral conductors 210, 215 are respectively electrically connected to the line terminal and neutral terminal, and are configured to supply electrical power to the device 100.

The core assembly 200 may further support a first coil 220 and a second coil 225. As illustrated, the first and second coils 220, 225 may respectively include first and second apertures 230, 235. In some embodiments, the first aperture 230 is configured to receive the line conductor 210, while the second aperture 235 is configured to receive the neutral conductor 215. In some embodiments, the first and second coils 220, 225 may respectively be embedded into first and second printed circuit boards 240, 245. In other embodiments, the first and second coils 220, 225 may be embedded into a single printed circuit board. In some embodiments, the first coil 220 and the second coil 225 are printed circuit board coils.

The core assembly 200 may additionally support a third coil 250 having a third aperture 255. In some embodiments, the third aperture 255 is configured to receive both the line conductor 210 and the neutral conductor 215.

Figure 3:
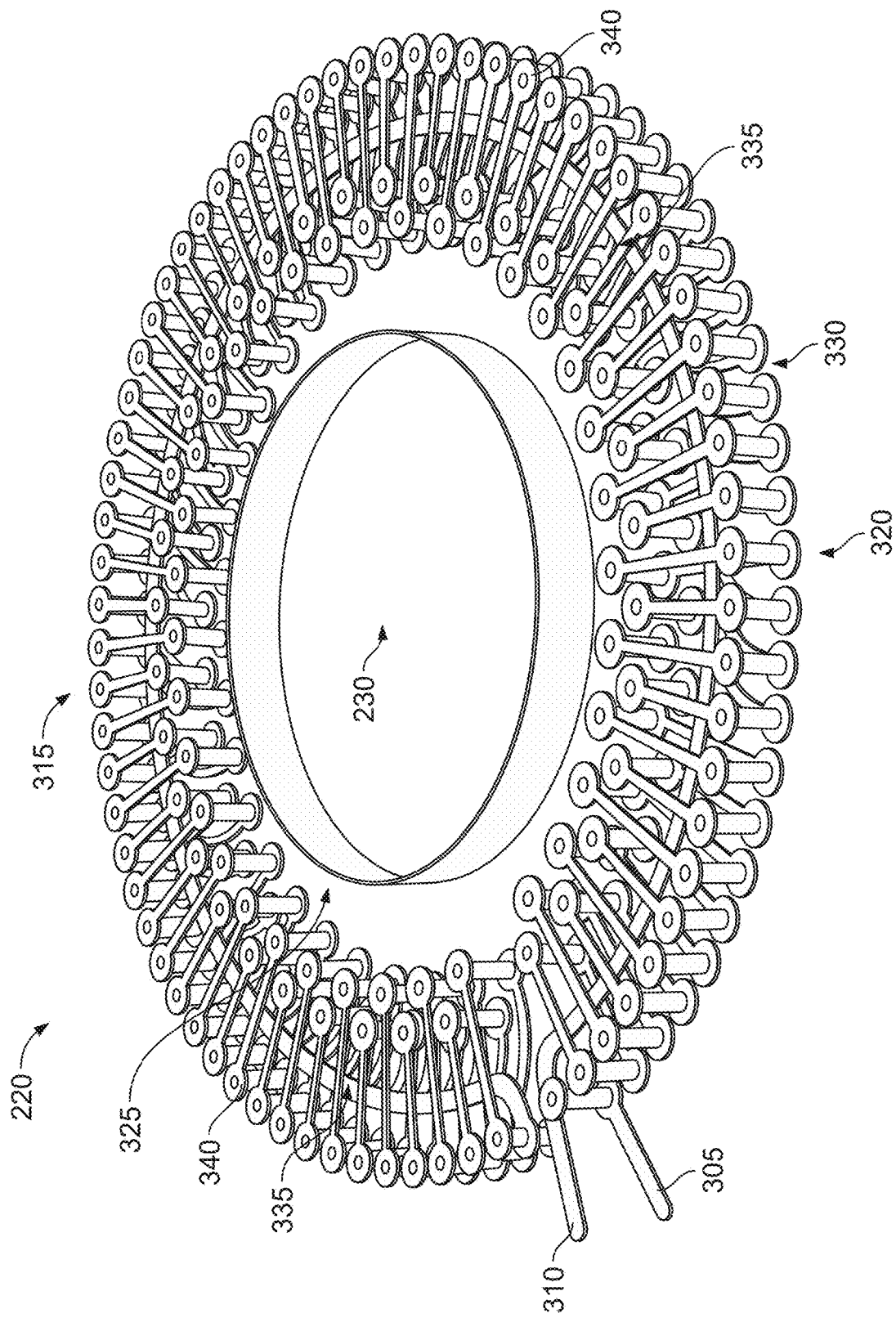
FIG. 3 is a perspective view of a coil of the circuit interrupting device of FIG. 1 according to some embodiments.

FIG. 3 illustrates one embodiment of the first coil 220 with the printed circuit board removed for illustrative purposes. As illustrated, the first coil 220 may be a Rogowski coil having an input 305 and an output 310. As illustrated, the coil 220 further includes an upper portion 315, a lower portion 320, an inner portion 325, an outer portion 330, a plurality of helical conductors 335, and a plurality of nodes 340, connecting the input 305 to the output 310. As illustrated, the helical conductors 335, along with the nodes 340, form the coil 220. For example, the plurality of conductors 335 form a portion of the coil 220 between the inner portion 325 and the outer portion 330, while the plurality of nodes 340 form the coil 220 between the upper portion 315 and the lower portion 320.

In some embodiments, the second coil 225 is also Rogowski coil, similar to coil 220. Although not illustrated, in some embodiments the third coil 250 may also be a Rogowski coil embedded on a printed circuit board (for example a third printed circuit board or a single printed circuit board including the first, second, and third coils 220, 225, 250. In some embodiments, coils 220, 225, and/or 250 are printed-circuit board coils that do not have a Rogowski coil configuration.

Figure 4:
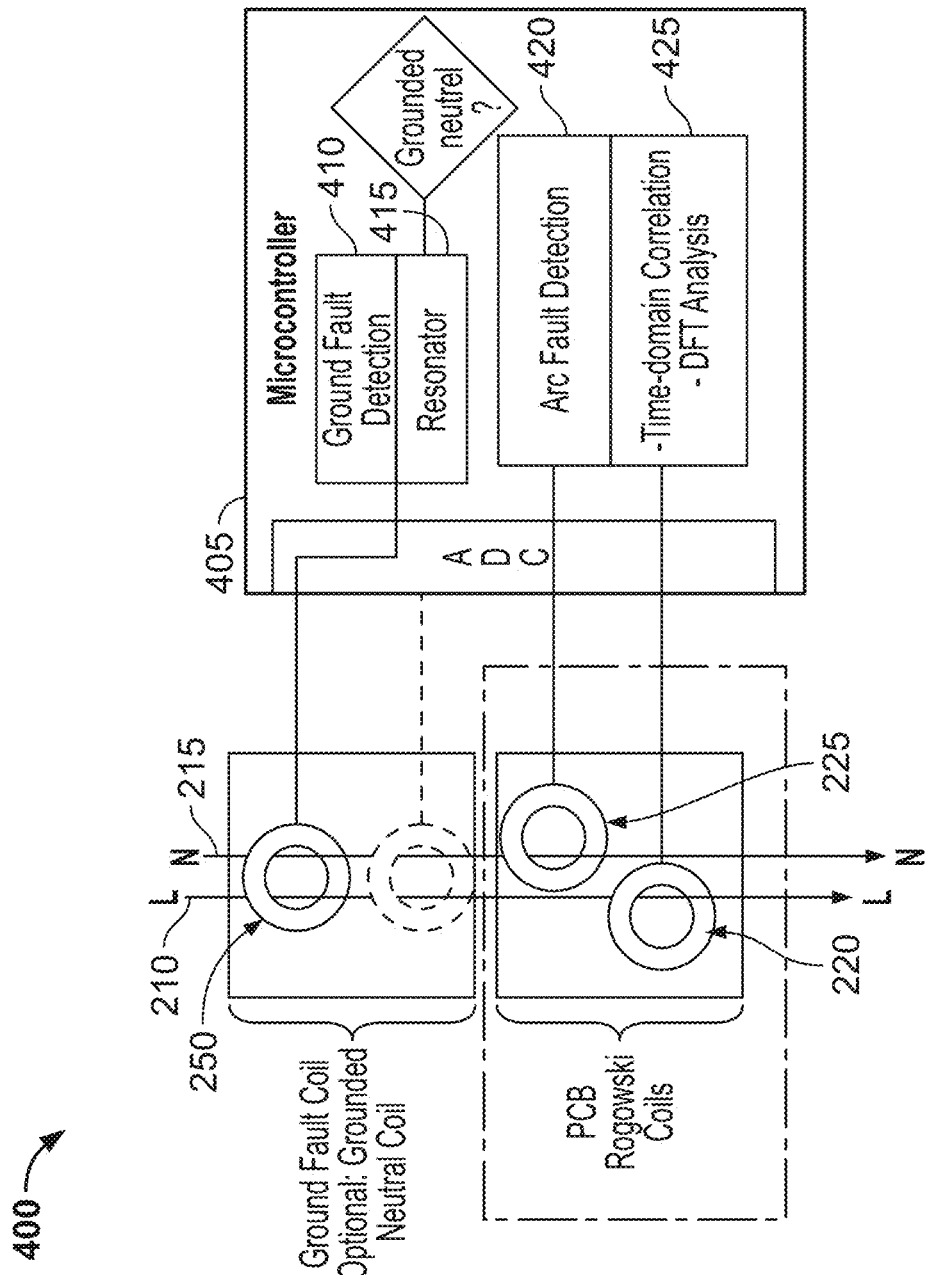
FIG. 4 is a block diagram of a control system of the circuit interrupting device of FIG. 1 according to some embodiments.

FIG. 4 is a block diagram of a control system, or testing circuit, 400 of the device 100 according to some embodiments. The control system 400 includes a controller, or microcontroller, 405 electrically connected to the first coil 220, the second coil 225, and the third coil 250. The controller 405 is configured to detect one or more fault conditions, and place the device 100 into a tripped state when the one or more fault conditions are detected. In some embodiments, the controller 405 is a well-known integrated circuit device having an electronic processor and a memory, such as but not limited to a 4145 device.

The controller 405 may include a ground fault detection unit 410, a resonator 415, an arc fault detection unit 420, and a time-domain correlator and analyzer 425. In some embodiments, the ground fault detection unit 410, the resonator 415, the arc fault detection unit 420, and/or the time-domain correlator and analyzer 425 are implemented in whole or in part in software. In some embodiments, there is no separate module, but rather the ground fault detection unit 410, the resonator 415, the arc fault detection unit 420, and/or the time-domain correlator and analyzer 425 are implemented using software stored in the memory of the controller 405 and executed by the processor of the controller 405.

The ground fault detection unit 410 is configured to analyze electric signals from the third coil 250. The ground fault detection unit 410 is configured to detect a ground fault (for example, a real ground fault, a simulated ground fault, a self-test ground fault, and/or a real or simulated grounded neutral fault based on the electric signals from the third coil 250. The resonator 415 is configured to analyze a frequency of the power supplied to the device 100.

The arc fault detection unit 420 is configured to analyze electric signal from the first coil 220 or from the first coil 220 and second coil 225. The arc fault detection unit 420 is configured to detect an arc fault (for example, a real arc fault, a simulated arc fault, and/or a self-test arc fault) based on the electric signals from the first coil 220 or from the first coil 220 and second coil 225. The time-domain correlator and analyzer 425 is configured to perform a time-domain transformation and/or analysis on the electric signals from the first coil 220 or from the first coil 220 and second coil 225. The transformed electric signals are then analyzed by the arc fault detection unit 420 to detect an arc fault. In some embodiments a discrete Fourier transform (DFT) is performed on the electric signal and then analyzed to further determine an arc fault.

Figure 5:
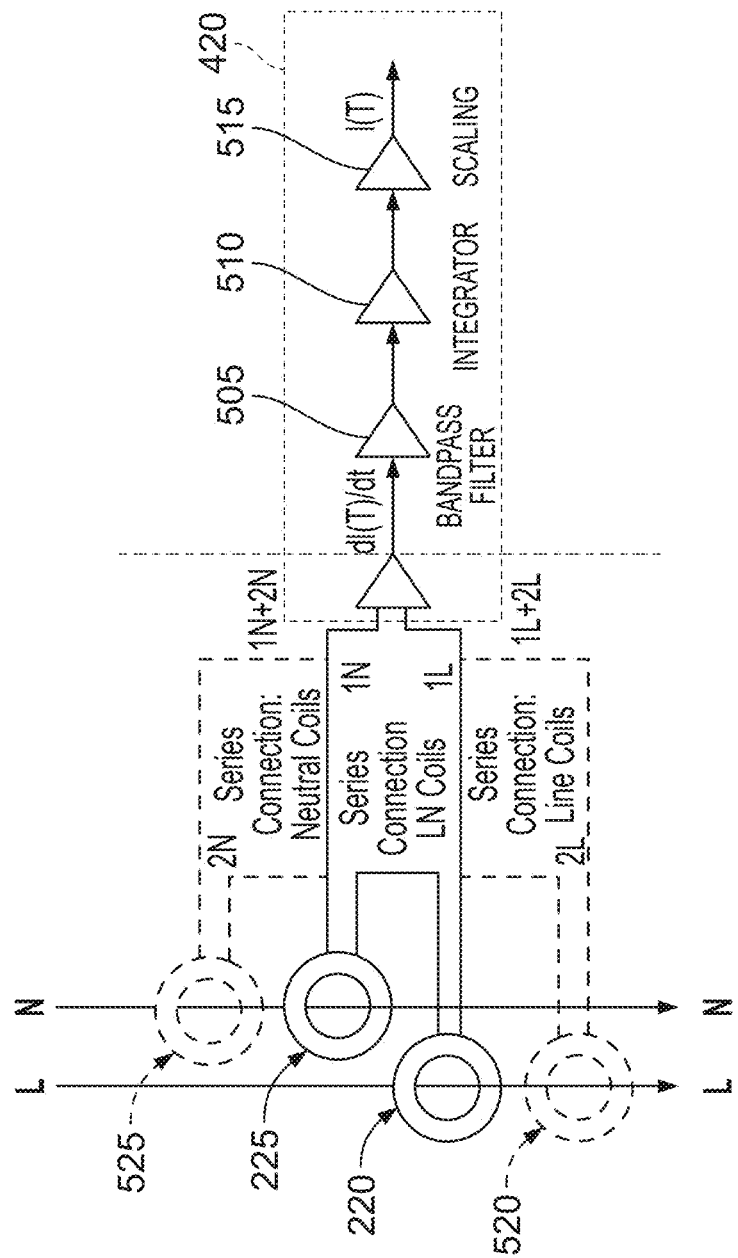
FIG. 5 is a block diagram of an arc fault detector of the control system of FIG. 4 according to some embodiments.

FIG. 5 is a block diagram of the arc fault detection unit 420 according to some embodiments. In such an embodiment, the arc fault detection unit 420 includes a bandpass filter 505, an integrator 510, and a gain stage, or scaling module, 515. The electric signals from the first coil 220 or from the first coil 220 and second coil 225 are filtered by the bandpass filter 505 and then integrated by integrator 510 in order to determine a voltage of the electric signal(s). In some embodiments, the voltage is proportional to a current flowing through the first coil 220 and/or the second coil 225. In some embodiments, the bandpass filter 505 is a 3-dB passband filter between 1-Hz and 8-kHz, which attenuates unnecessary low and high frequency content that might otherwise saturate the integrator 510. Once integrated, the gain stage 515 scales the signal to a full-scale input voltage of an analog-to-digital (A/D) converter, which will sample the signal for subsequent digital post-processing. For example, a 30-Arms line-current may be scaled to a full-scale voltage of approximately 3.0 Vdc by the A/D converter. In some embodiments, the A/D converter is embedded within the controller 405.

As illustrated in FIG. 5, in some embodiments, the interrupter 100 may further include coils 520, 525. Coil 520 may be electrically connected to coil 220 in a series-type configuration, while coil 525 may be electrically connected to coil 225 in a series-type configuration. Coils 520, 220 and coils 525, 225, when respectively electrically connected in a series-type configuration, may produce respective measured signals that are multiplied by a n number of coils connected in the series-type configuration. Such an embodiment may allow for a greater measured signal.

Figure 6:
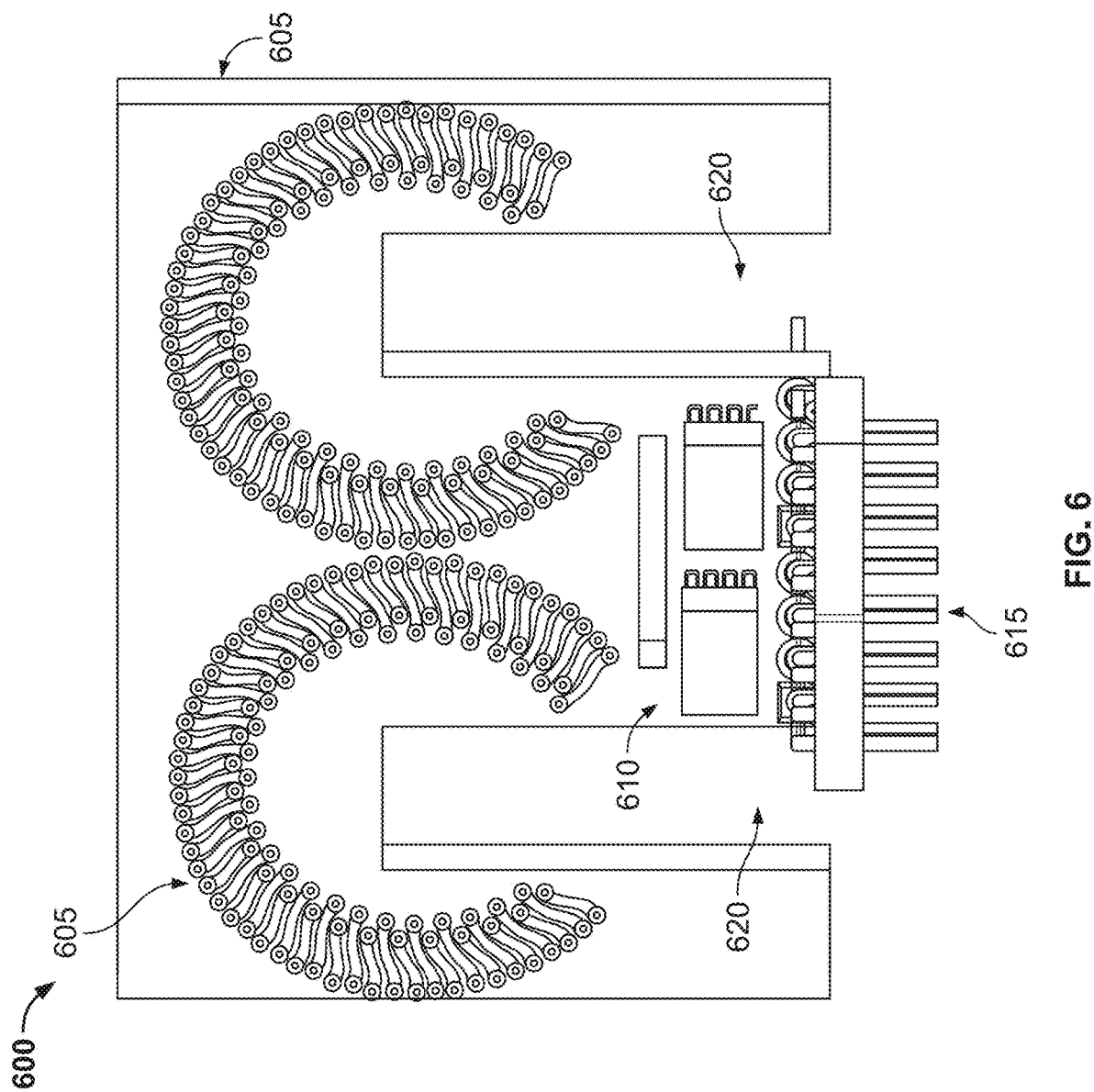
FIG. 6 is a perspective view of a printed-circuit board of a circuit interrupting device according to some embodiments.

FIG. 6 illustrates a printed-circuit board 600 according to some embodiments. Printed-circuit board 600 may be part of, or included in, circuit interrupting device 100. The printed-circuit board 600 may include one or more printed-circuit board coils 605, one or more electronic components 610, and one or more electrical pins 615. Printed-circuit board coils 605 may be substantially similar to coils 220, 225, and/or 250. The one or more electrical components 610 may include one or more components discussed above with respect to FIGS. 4 and 5. For example, the one or more electrical components 610 may be, or may include, a programmable microcontroller. The one or more electrical pins 615 may be configured to electrically and/or communicatively connect the printed-circuit board 600 to other components of the circuit interrupting device 100.

In the illustrated embodiment, printed-circuit board 600 further includes one or more slots, or apertures, 620. The slots 620 may be configured to receive the line conductor 210 and/or neutral conductor 215.

Figure 7:
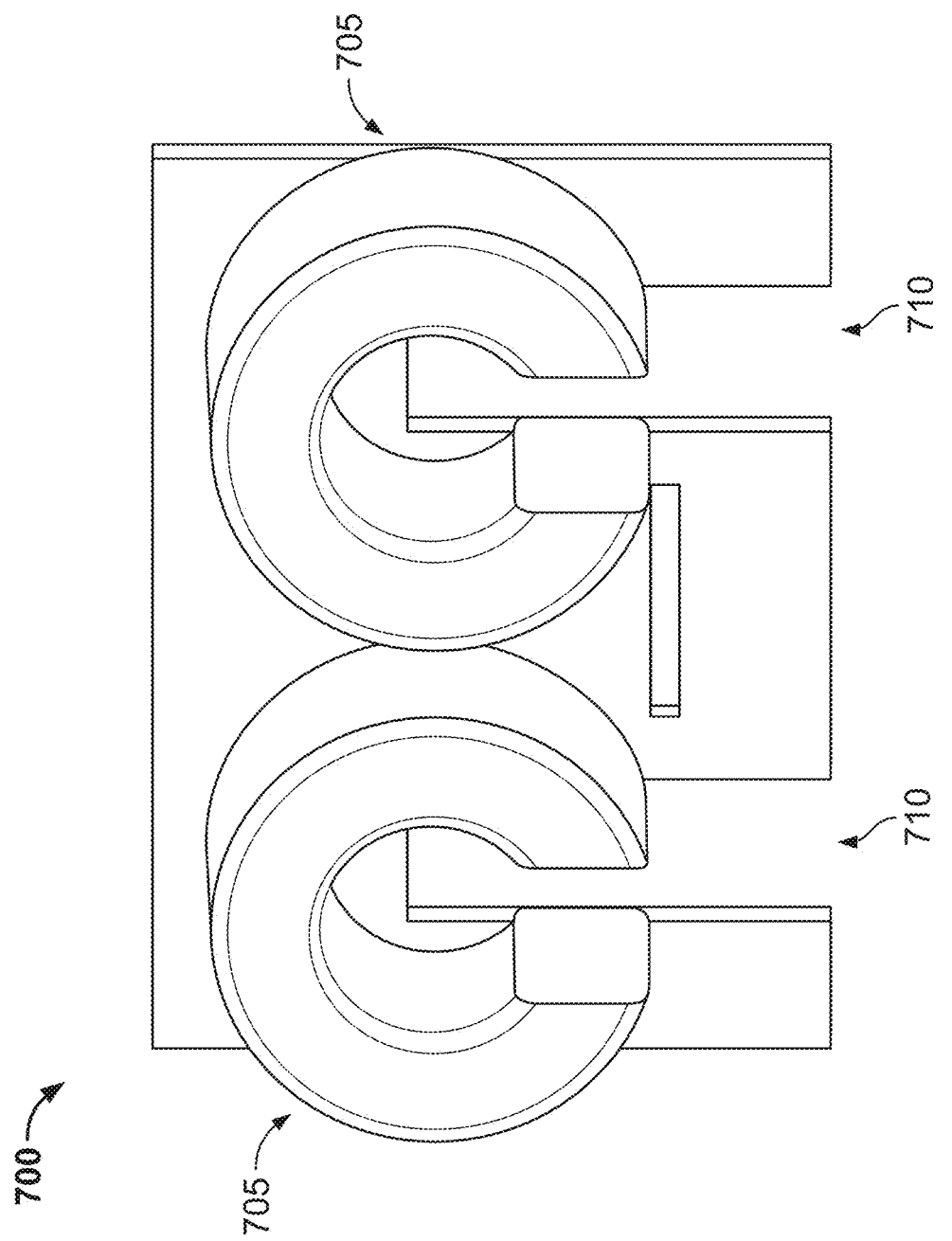
FIG. 7 is a perspective view of a printed-circuit board of a circuit interrupting device according to some embodiments.

FIG. 7 illustrates a printed-circuit board 700 according to other embodiments. Printed-circuit board 700 may be part of, or included in, circuit interrupting device 100. The printed-circuit board 700 may include one or more coils 705 and one or more slots, or apertures, 710. In the illustrated embodiment, the one or more coils 705 are wire-wound coils. The slots 710 may be configured to receive the line conductor 210 and/or neutral conductor 215.

In operation, the coils (for example, coils 220, 225, 250, 605, and/or 705) may be used to sense and/or monitor a current. An arc condition may then be determined based on the current. In some embodiment, an arc condition may be determined by determining if a correlation condition, a volatility condition, and/or an impulse condition exists. Additionally, in some embodiments, an in-rush condition may be detected via the coils.

Thus, the application provides, among other things, a circuit interrupting device having a printed circuit board coil. Various features and advantages of the application are set forth in the following claims. For example, one advantage of the application includes an increase in within an electrical receptacle due to the reduced footprint of using one or more printed circuit board coils.

What is claimed is:

1. A circuit interrupter comprising:
a line conductor;
a printed-circuit board coil embedded on a printed circuit board, the printed circuit board including a slot having a first end and a second end opposite the first end, the first end of the slot located at a center of through the printed-circuit board coil and the second end of the slot located outside the printed-circuit board coil, wherein the line conductor is received by the slot such that the line conductor passes through the center of the printed-circuit board coil; and a test circuit electrically connected to the printed-circuit board coil; the test circuit configured to determine an arc fault condition based on a signal of the printed-circuit board coil.

2. The circuit interrupter of claim 1, further comprising a second printed-circuit board coil embedded on the printed circuit board, the printed circuit board further including a second slot, wherein a neutral conductor is received by the second printed-circuit board coil.

3. The circuit interrupter of claim 1, wherein the test circuit determines the arc fault condition by:
   receiving the signal,
   performing a time-domain analysis on the signal, and
   determining the arc fault condition based on the time-domain analysis.

4. The circuit interrupter of claim 1, wherein the test circuit includes a bandpass filter configured to filter the signal.

5. The circuit interrupter of claim 1, wherein the test circuit includes an integrator configured to determine a signal voltage proportional to a current of the signal.

6. The circuit interrupter of claim 1, wherein the test circuit includes a gain stage configured to scale the signal.

7. The circuit interrupter of claim 1, further comprising a second printed-circuit board coil electrically connected to the test circuit.

8. The circuit interrupter of claim 7, wherein the test circuit is further configured to:
   determine a ground fault based on one or more signals of the second printed-circuit board coil.

9. The circuit interrupter of claim 1, wherein the printed-circuit board coil is a Rogowski coil.

10. The circuit interrupter of claim 1, wherein the printed-circuit board coil and the test circuit are located on the printed-circuit board.

* * * * *